United States Patent
Hung et al.

(10) Patent No.: US 9,268,210 B2
(45) Date of Patent: Feb. 23, 2016

(54) DOUBLE-EXPOSURE MASK STRUCTURE AND PHOTOLITHOGRAPHY METHOD THEREOF

(71) Applicant: Micron Technology, Inc., Boise, ID (US)

(72) Inventors: Yung-Wen Hung, Taichung (TW); Cheng-Shuai Li, Taichung (TW); Yun-Ting Shen, Taichung (TW)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 13/964,949

(22) Filed: Aug. 12, 2013

(65) Prior Publication Data

US 2015/0044600 A1 Feb. 12, 2015

(51) Int. Cl.
*G03F 1/38* (2012.01)
*G03F 7/20* (2006.01)

(52) U.S. Cl.
CPC ............. *G03F 1/38* (2013.01); *G03F 7/2022* (2013.01)

(58) Field of Classification Search
CPC .................. G03F 1/38; G03F 7/2022
USPC ............................... 430/5, 322, 394
See application file for complete search history.

(56) References Cited

U.S. PATENT DOCUMENTS

| 2006/0057471 | A1* | 3/2006 | Schenau et al. | 430/5 |
| 2008/0153299 | A1 | 6/2008 | Kim | |
| 2013/0280645 | A1* | 10/2013 | Kuo et al. | 430/5 |

* cited by examiner

*Primary Examiner* — Stephen Rosasco
(74) *Attorney, Agent, or Firm* — TraskBritt

(57) ABSTRACT

Double-exposure mask structure and photolithography method for performing a photolithography process on a substrate are provided. The substrate has a central region and a margin region. A double-exposure mask structure includes a plurality of parallel and spaced first masks corresponding to the central region, a plurality of parallel and spaced second masks corresponding to the central region, and a plurality of auxiliary masks. The second masks intersect with the first masks to form a plurality of overlapping regions. The auxiliary masks are not in contact with one another, and correspond to the Second masks to assist the overlapping regions neighboring to the auxiliary masks to have sufficient depth of focus for photolithography. With the auxiliary masks, the overlapping regions in the central region and neighboring to the margin region can have preferred photolithography and etching effect.

9 Claims, 7 Drawing Sheets

DOUBLE-EXPOSURE MASK STRUCTURE AND PHOTOLITHOGRAPHY METHOD THEREOF

FIELD OF THE INVENTION

The present invention relates to a mask structure and a photolithography method, and, particularly, to a double-exposure mask structure and a photolithography method thereof.

BACKGROUND OF THE INVENTION

The miniaturization of a semiconductor has long developed according to Moore's Law, namely, the number of transistors and resistance on one single wafer double each year. Such theorem has quite matched actual situations for the past three decades, and the speed of doubling the number of transistors and resistance on one single wafer currently becomes every 18 months. In principle, the manufacture of a semiconductor is performed by photolithography. As the ever-decreasing size of process, severe complications caused by effect of light diffraction have gradually emerged.

To fit a larger number of transistors into a same-sized wafer, extreme ultraviolet (EUV) and double-exposure techniques are currently developed for reducing a line width and thus the size of transistors. Due to immaturity of the EUV technique, the double-exposure technique accounts as a principal technique for reducing the size of semiconductors. In a double exposure, an exposure position is adjusted by means of displacement after a first exposure and before a second exposure, so as to prevent an incorrect exposure position caused by light diffraction. For instance, the U.S. Patent Publication No. 2008/153299, "Semiconductor Device and Method for Forming a Pattern in the Same with Double Exposure Technology," discloses a double-exposure technology associated with a dynamic random access memory (DRAM) for effectively increasing a yield rate.

FIGS. 1A and 1B show schematic diagrams of a double-exposure mask structure and an etch result. The mask structure includes a substrate 1, a plurality of first masks 2 formed on the substrate 1 and parallel to a first direction, a plurality of second masks 3 formed on the substrate 1 and are perpendicular to the first direction, and a plurality of marginal auxiliary masks 4 formed on the substrate 1 and parallel to the first direction. The first masks 2 and the second masks 3 are overlapped to form a plurality of overlapping points 5. According to whether an etching process is a positive photoresist process or a negative photoresist process, the substrate 1 forms holes or pillars at positions corresponding to the overlapping points 5. FIG. 1B corresponds to a region demarcated by dotted lines in FIG. 1A. Assuming the negative photoresist is used in photolithography, holes 6 are formed at the positions of the overlapping points 5. As the overlapping points 5 at margins are unable to utilize neighboring masks to obtain a sufficient depth of focus (DOF) to form the holes 6, the marginal auxiliary masks 4 are required to be set at edges of the first masks 2 to assist the substrate 1 at the positions of the overlapping points 5 neighboring to the marginal auxiliary masks 4 to form the holes 6.

FIG. 2 shows a curve diagram of a ratio of holes. Referring to FIGS. 2 and 1B, a critical dimension (CD) of H1 corresponding to a marginal hole 7 located at a margin is apparently smaller than critical dimensions of H2 to H5 corresponding to holes 6 at a central region. That is, even with the assistance of the marginal auxiliary masks 4, the marginal holes 7 still suffer from an inadequate critical dimension suitable to perform subsequent processes.

SUMMARY OF THE INVENTION

The primary object of the present invention is to solve an issue of the prior art, in which critical dimension of holes located at a borer is too small to perform subsequent processes.

To achieve the above object, a double-exposure mask structure for performing a photolithography process on a substrate is provided. The substrate has a central region and a margin region. The mask structure comprises a plurality of parallel and spaced first masks corresponding to the central region, a plurality of parallel and spaced second masks corresponding to the central region, a margin connecting section which is parallel to the first masks and connected to end points of the second masks, a plurality of parallel and spaced marginal auxiliary masks which are disposed at one side of the margin connecting section away from the first masks, and a plurality of auxiliary masks arranged along a straight line. The first masks intersect the second masks to form a plurality of overlapping regions. The margin connecting section corresponds to intersections of between the central region and the margin region, and one of the first masks neighboring to the margin connecting section is defined as a marginal first mask. The marginal auxiliary masks parallel to the first masks and correspond to the margin region. The auxiliary masks are disposed between the margin connecting section and the marginal first mask in a straight line. Further, the auxiliary masks are not in contact with each other and correspond to the second masks to assist the overlapping regions neighboring to the auxiliary masks to have sufficient depth of focus for photolithography.

A double-exposure photolithography method is also disclosed by the present invention for performing a photolithography process on a substrate, which includes a central region and a margin region. The double-exposure photolithography method comprises the following steps:

In step S1, the central region is exposed by using the parallel and spaced second masks to form a plurality of corresponding second photoresists. At the same time, the margin region neighboring to the central region is exposed by using the margin connecting section, which is connected to end points of the second masks, to form a marginal photoresist.

In step S2, the parallel and spaced first masks and the auxiliary masks disposed in a straight line and parallel to the first masks are provided. The first masks and the auxiliary masks are parallel to the margin connecting section, and the auxiliary masks are not in contact with one another.

In step S3, the central region is exposed by using the first masks to form a plurality of first photoresists intersecting the second photoresists and a plurality of overlapping photoresist regions. One of the first photoresists neighboring to the marginal photoresist is defined as a "setting photoresist." The auxiliary masks are disposed between the setting photoresist and the marginal photoresist and corresponding to the second photoresist to perform a photolithography with the first masks.

In step S4, another photolithography is performed on the margin region by using a plurality of marginal auxiliary masks disposed at the margin region and parallel to the first mask's region while step S3 is performed.

In conclusion of the above description, the present invention provides the following features:

First of all, through the design of the auxiliary masks, the overlapping regions neighboring to the margin region are assisted to have sufficient depth of focus for photolithography.

Second, in fabrication processes of semiconductors where a linewidth is ever-decreasing, a margin of exposure and focusing is increased with the assistance of the auxiliary masks.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1A:
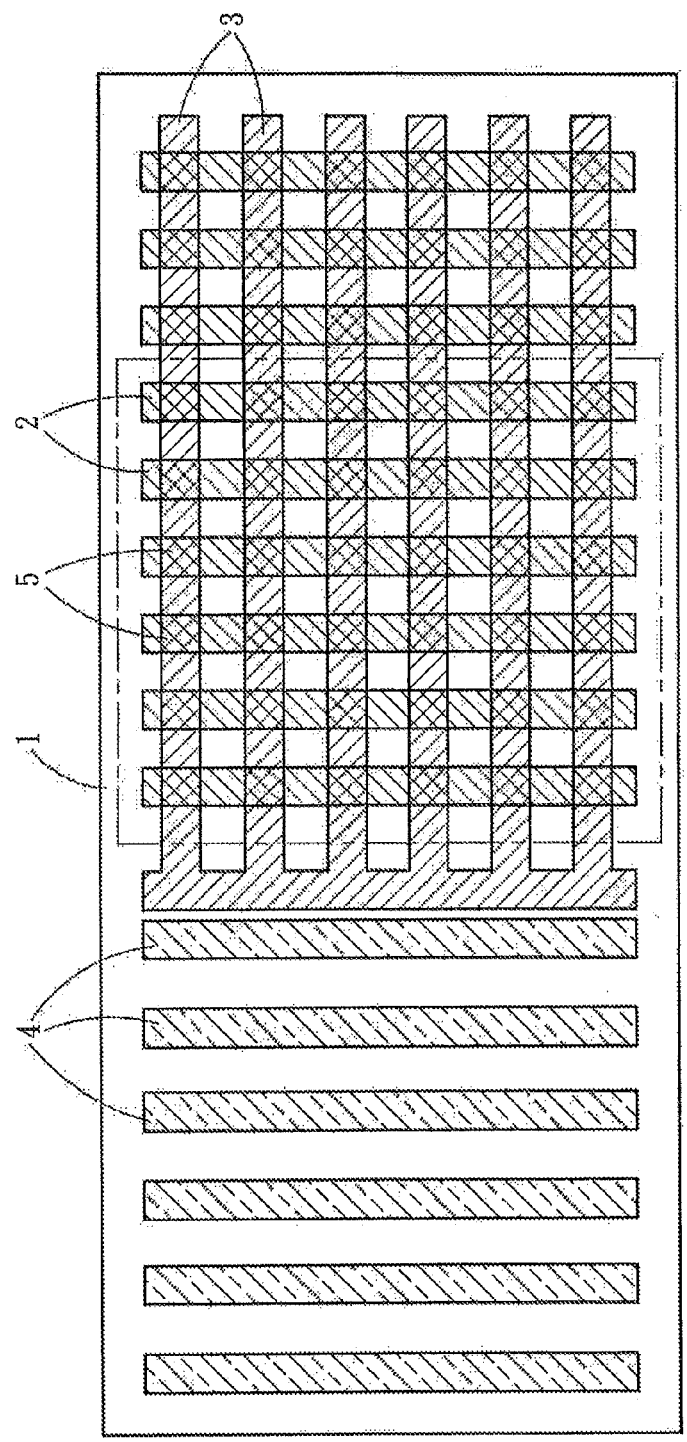
FIG. 1A is a schematic diagram of a mask structure of the prior art.
Figure 1B:
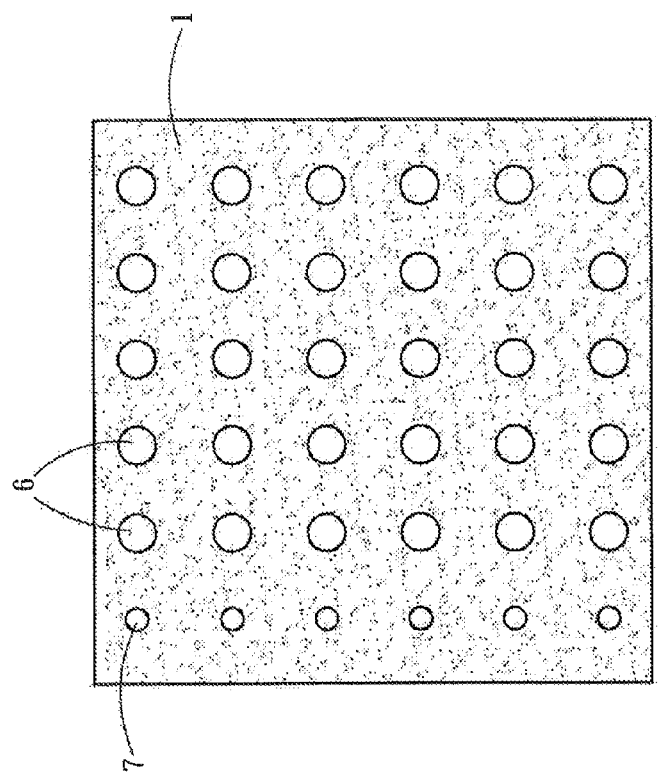
FIG. 1B is a schematic diagram of etched holes of the prior art.
Figure 2:
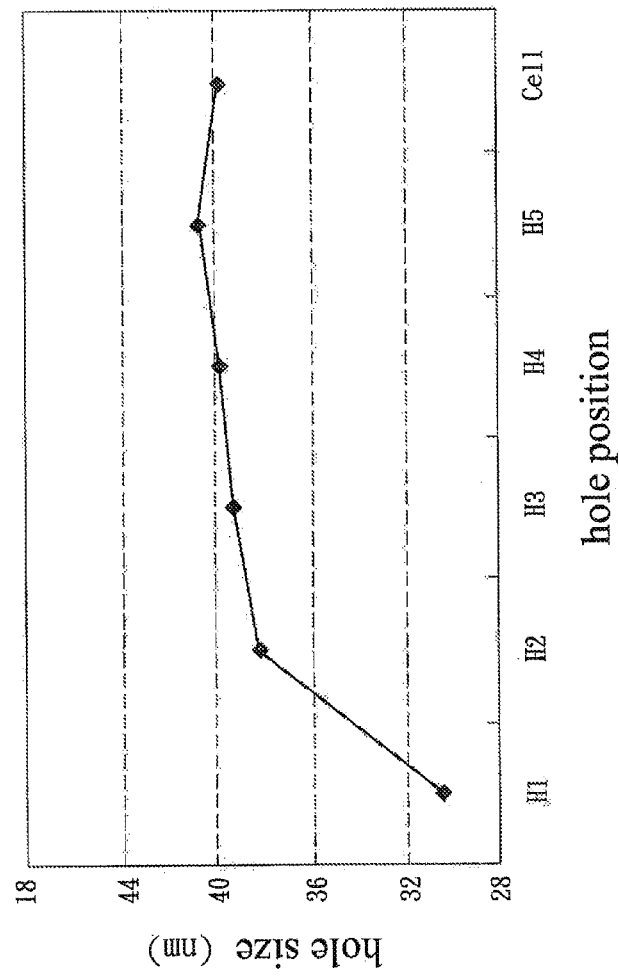
FIG. 2 is a curve diagram of a ratio of holes of the prior art.
Figure 3:
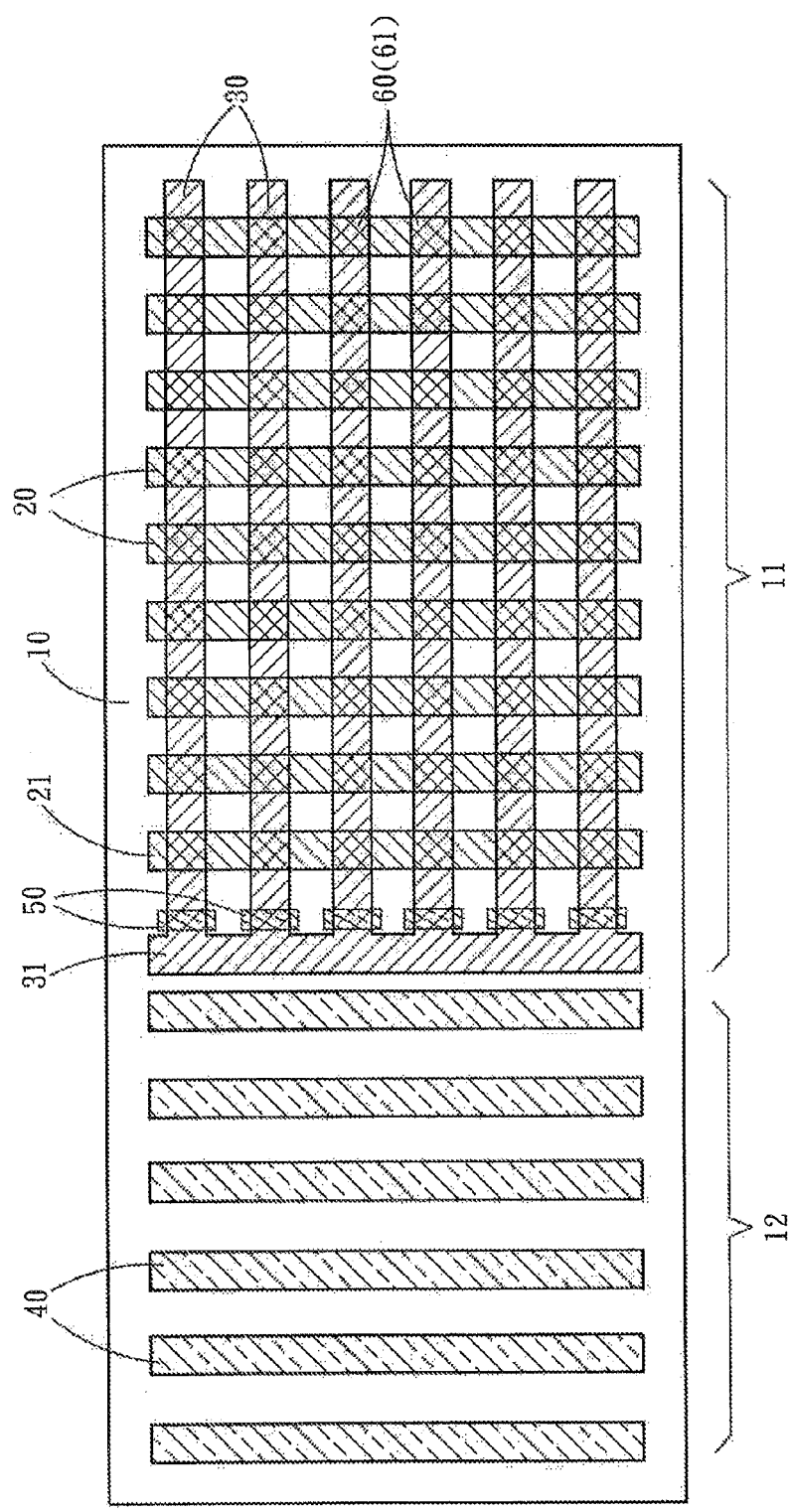
FIG. 3 is a schematic diagram of a mask structure according to a first embodiment of the present invention.

FIG. 3 shows a double-exposure mask structure of the present invention for performing a photolithography process on a substrate 10 having a central region 11 and a margin region 12. The mask structure comprises a plurality of parallel and spaced first masks 20 corresponding to the central region 11, a plurality of parallel and spaced second masks 30 corresponding to the central region 11, a margin connecting section 31 which is parallel to the first masks 20 and connected to end points of the second masks 30, a plurality of parallel and spaced marginal auxiliary masks 40 which are disposed at one side of the margin connecting section 31 away from the first masks 20, and a plurality of auxiliary masks 50 arranged along a straight line. The second masks 30 intersect the first masks 20 to form a plurality of overlapping regions 60. The margin connecting section 31 corresponds to intersections of the central region 11 and the margin region 12, and one of the first masks 20 neighboring to the margin connecting section 31 is defined as a marginal first mask 21. The marginal auxiliary masks 40 are parallel to the first masks 20 and corresponding to the margin region 12. The auxiliary masks 50 are disposed between the margin connecting section 31 and the marginal first mask 21 in a straight line. Further, the auxiliary masks 50 are not in contact with each other and correspond to the second masks 30. Namely, the auxiliary masks 50 have gaps corresponding to the gaps between the second masks 30 to make the auxiliary masks 50 separate from each other and overlap on the second masks 30. As such, the overlapping regions 60 neighboring to the auxiliary masks 50 are assisted to obtain sufficient depth of focus for photolithography. A length of the auxiliary masks 50 along a direction of the first masks 20 is greater than a width of the second masks 30 to allow the auxiliary masks 50 to protrude an area of the second masks 30. Thus, a more effective photolithography process can be performed in a manner that the auxiliary masks 50 covered a larger area.

Figure 4:
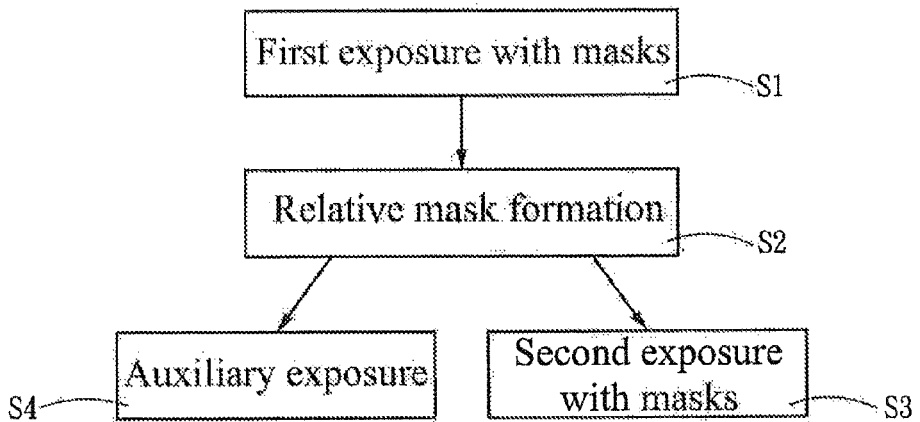
FIG. 4 is a flowchart of an embodiment of the present invention.

A double-exposure photolithography method is also disclosed by the present invention. Referring to FIG. 4, the method comprises the following steps:

In step S1, a process of first exposure with masks is performed. The central region 11 is exposed by using the parallel and spaced second masks 30 to form a plurality of corresponding second photoresists (not shown). At the same time, the margin region 12 neighboring to the central region 11 is exposed by using the margin connecting section 31 connected to end points of the second masks 30 to form a marginal photoresist (not shown).

In step S2, a process of relative mask formation step is performed. The parallel and spaced first masks 20 and the auxiliary masks 50 disposed in a straight line and parallel to the first masks 20 are formed. The first masks 20 and the auxiliary masks 50 are parallel to the margin connecting section 31, and the auxiliary masks 50 are not in contact with one another.

In step S3, a process of second exposure with masks is performed. The central region 11 is exposed by using the first masks 20 to form a plurality of first photoresists (not shown) intersecting the second photoresists and a plurality of overlapping photoresist regions 61 (see FIG. 3) corresponding to the overlapping region aforesaid. Furthermore, one of the first photoresists neighboring to the marginal photoresist is defined as a setting photoresist. The auxiliary masks 50 are disposed between the setting photoresist and the marginal photoresist and corresponding to the second photoresist to perform photolithography jointly with the first masks 20. A length of the auxiliary masks 50 along a direction of the first masks 20 is greater than a width of the second masks 30.

In step S4, a process of auxiliary exposure is performed. While performing step S3, another photolithography is performed on the margin region 12 by using a plurality of marginal auxiliary masks 40 parallel to the first masks and disposed at the margin region 12. The marginal auxiliary masks 40 also assist the formation of the first photoresists and the second photoresists at the central region 11.

Figure 5:
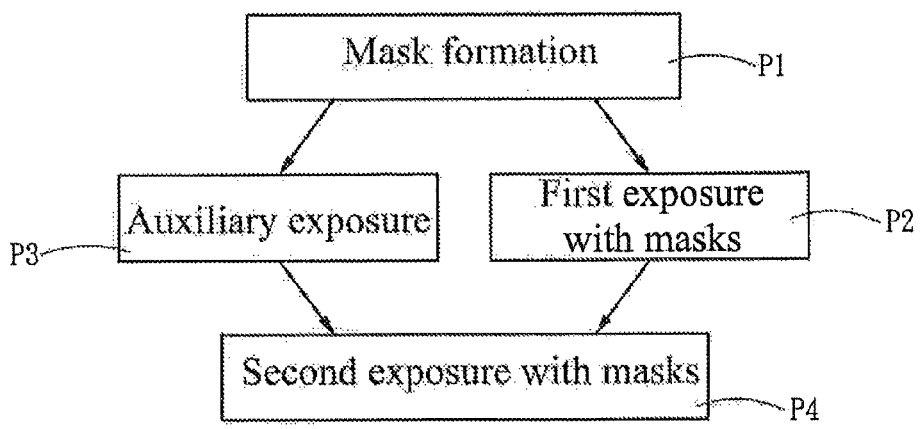
FIG. 5 is a flowchart of another embodiment of the present invention.

In the above description, the photolithography process for the second photoresists using the second masks 30 is performed at first. In practice, the sequence of mask exposure is not limited to a specific order. For example, the photolithography process using the first masks 20 and the auxiliary masks 50 may also be performed first, followed by performing the photolithography process using the second masks 30. Details of the above process are given with reference to FIG. 5 below:

In step P1, a process of mask formation is performed. The parallel and spaced first masks 20 and the auxiliary masks 50 disposed at one side of the first masks 20 in a straight line and parallel to the first masks 20 are formed. The auxiliary masks 50 are not in contact with one another.

In step P2, a process of first exposure with masks is performed. The central region 11 is exposed by using the first masks 20 to form the first photoresists, and one of the photoresist at the margin thereof is defined as a setting photoresist. The auxiliary masks 50 are disposed at one side of the setting photoresist away from the first photoresists to perform photolithography jointly with the first masks 50.

In step P3, a process of auxiliary exposure is performed. While performing step P2, another photolithography is performed on the margin region 12 by using the marginal auxiliary masks 40 disposed at the margin region 12 and parallel to the first masks 20 to assist the first masks 20 to perform photolithography.

In step P4, a process of second exposure with masks is performed. The central region 11 is exposed by using the parallel and spaced second masks 30 to form the second photoresists intersecting the first photoresists and the overlapping photoresists regions 61. Meanwhile, the margin region 12 neighboring to the central region 11 is exposed by using the margin connecting section 31 connected to ends point of the second masks 30 to form the marginal photoresist. The marginal photoresist is parallel to the first photoresists, and positions for performing photolithography by using the second masks 30 correspond to positions of the auxiliary masks 50.

Figure 6:
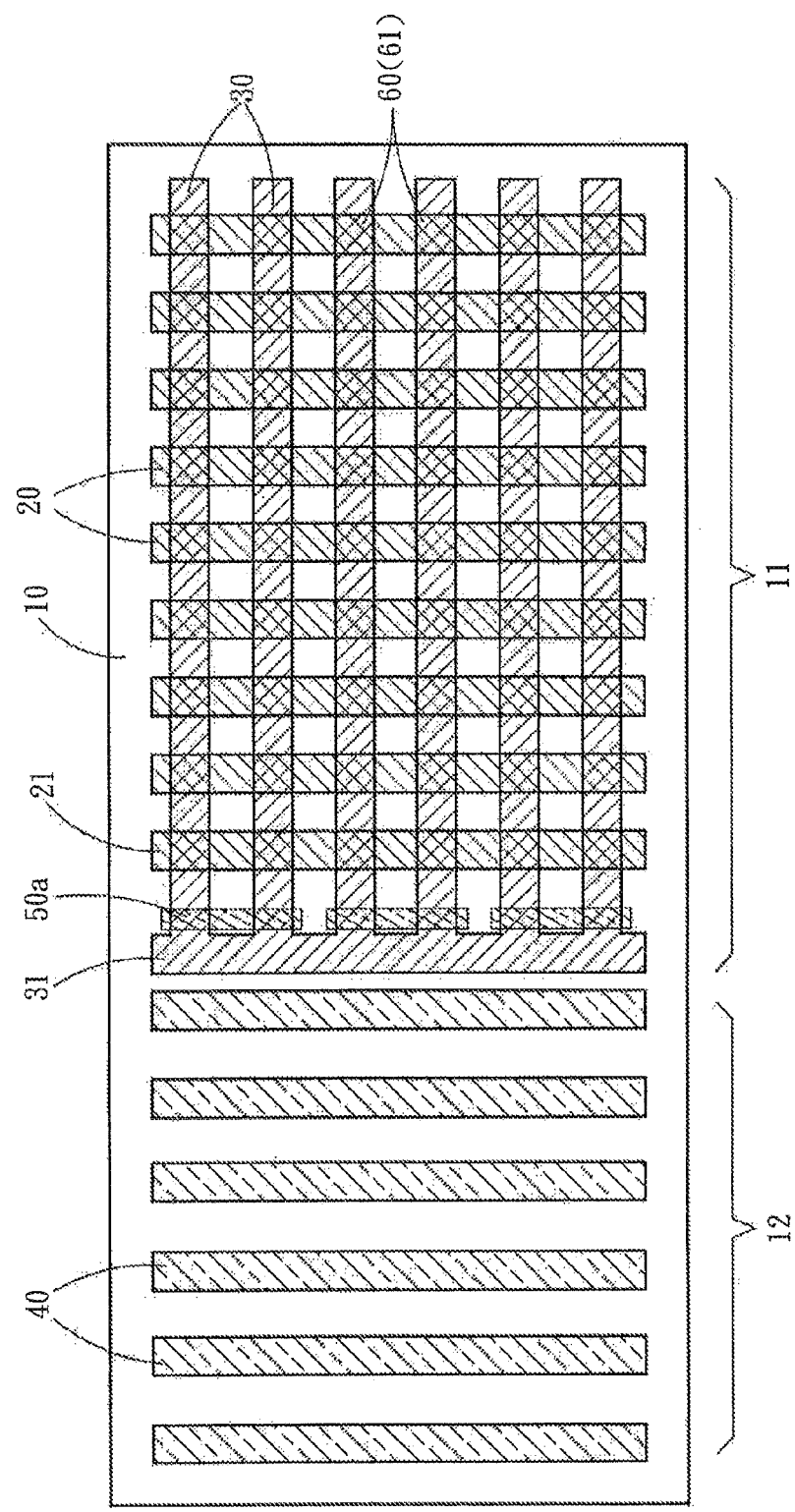
FIG. 6 is a schematic diagram of a mask structure according to a second embodiment of the present invention.

FIG. 6 shows a second embodiment of the present invention. In addition to corresponding to the second masks 30 and having an equal number as the number of the second masks 30, the number of auxiliary masks 50a may be a half of that of the second masks 30, and overlap and cross neighboring second masks 30 in a straight line. Further, each of the auxiliary masks 50a is spaced by a distance. That is, a length of the auxiliary masks 50a is greater than its length in the first embodiment, such that one auxiliary mask 50a is connected to every two second masks 30. The auxiliary masks 50a are similarly disposed in a straight line and spaced from each other by a distance from one another. As such, the purpose of assisting the overlapping photoresist regions 61 to perform photolithography can also be achieved.

It should be noted that, the auxiliary masks 50 and 50a are not connected to one another. If the auxiliary masks 50 and 50a are connected to one another and form a straight line, the auxiliary masks 50 and 50a shall render a function similar to that of the first masks 20. Therefore, at overlapping regions of the auxiliary masks 50 and 50a with the second masks 30, the same etching or reserved situations at the overlapping photoresist regions 61 will be incurred, which leads to unnecessary parts in the fabrication process.

Figure 7:
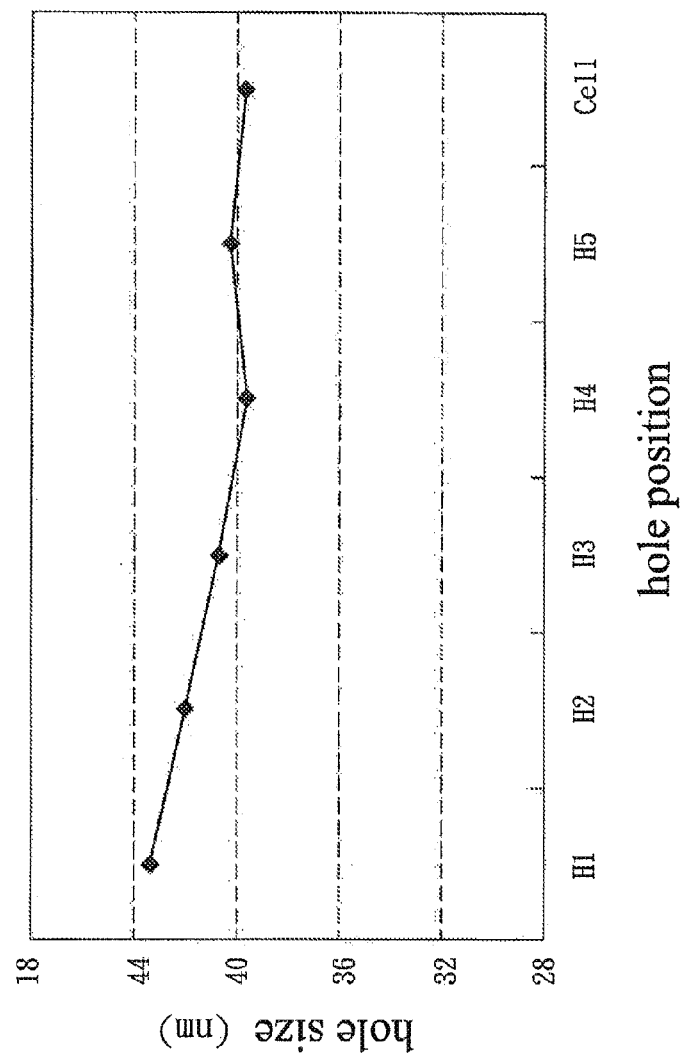
FIG. 7 is a curve diagram of a ratio of holes of the present invention.

Referring to FIG. 7 depicting the curve diagram of a ratio of a hole position versus a hole size, it is observed that the critical dimension of a hole position H1 at the central region 11 neighboring to the margin region 12, rather than being smaller than the critical dimensions of other hole positions H2 to H5 at the central region 11, is instead slightly larger than the critical dimensions of the hole positions H2 to H5 at the central region 11, thereby effectively solving the insufficient critical dimension of holes at margin positions.

In conclusion, the present invention provides the following advantages:

First of all, through the design of the auxiliary masks, the overlapping regions neighboring to the margin region are assisted to have sufficient depth of focus for photolithography.

Second, in fabrication processes of semiconductors where a linewidth is ever-decreasing, a margin of exposure and focusing is increased with the assistance provided by the auxiliary masks.

Further, with the auxiliary masks that cross the second masks and overlap on the second masks, a focusing capability is effectively enhanced.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments that do not depart from the spirit and scope of the invention.

What is claimed is:

1. A double-exposure mask structure, comprising:
   a first section configured and positioned to pattern a central region of a substrate and comprising parallel mask structures and additional parallel mask structures perpendicularly intersecting the parallel mask structures;
   a second section configured and positioned to pattern a margin region of the substrate adjacent the central region of the substrate and comprising parallel marginal auxiliary mask structures oriented parallel to the parallel mask structures of the first section;
   a third section between the first section and the second section and configured and positioned to pattern an intersection between the central region of the substrate and the marginal region of the substrate; and
   a fourth section between the first section and the third section and comprising discrete auxiliary mask structures arranged in a line oriented parallel to the parallel mask structures of the first section, each of the discrete auxiliary mask structures independently overlying one or two of the additional parallel mask structures of the first section.

2. The double-exposure mask structure of claim 1, wherein a length of each of the discrete auxiliary mask structures extending in a direction of the parallel mask structures is greater than a width of one of the additional parallel mask structures thereunder.

3. The double-exposure mask structure of claim 1, wherein a quantity of the discrete auxiliary mask structures is half a quantity of the additional parallel mask structures, each of the discrete auxiliary mask structures independently overlying two of the additional parallel mask structures.

4. A double-exposure photolithography method, comprising:
   forming parallel mask structures and a marginal mask structure connected to ends of the parallel mask structures over a substrate exhibiting a central region and a margin region adjacent the central region, the parallel mask structures positioned over the central region and the marginal mask structure positioned over the margin region;
   exposing the substrate to radiation using the parallel mask structures and the marginal mask structure to form parallel photoresist structures in the central region of the substrate and a marginal photoresist structure in the margin region of the substrate;
   forming additional parallel mask structures and discrete auxiliary mask structures over the central region of the substrate, each of the additional parallel mask structures and the discrete auxiliary mask structures oriented perpendicular to the parallel mask structures, and the discrete auxiliary mask structures arranged in a line between the marginal mask structure and one of the additional parallel mask structures most proximate the marginal mask structure;
   forming parallel marginal auxiliary mask structures over the margin region of the substrate, the parallel marginal auxiliary mask structures oriented parallel to the additional parallel mask structures and positioned adjacent the marginal mask structure; and
   exposing the substrate to additional radiation using the additional parallel mask structures, the discrete auxiliary mask structures, and the parallel marginal auxiliary mask structures to form additional parallel photoresist structures in the central region of the substrate and parallel marginal auxiliary photoresist structures in the margin region of the substrate, the additional parallel photoresist structures perpendicularly intersecting the parallel photoresist structures.

5. The double-exposure photolithography method of claim 4, wherein a length of each of the discrete auxiliary mask structures extending in a direction of the additional parallel mask structures is greater than a width of one of the parallel mask structures thereunder.

6. The double-exposure photolithography method of claim 4, wherein a quantity of the discrete auxiliary mask structures is half a quantity of the parallel mask structures, each of the discrete auxiliary mask structures independently overlying two of the parallel mask structures.

7. A double-exposure photolithography method, comprising:
   forming parallel mask structures and discrete auxiliary mask structures over a substrate exhibiting a central region and a margin region adjacent the central region, the discrete auxiliary mask structures arranged in a line oriented parallel to the parallel mask structures and positioned adjacent the parallel mask structures;
   forming parallel marginal auxiliary mask structures over the margin region of the substrate, the parallel marginal auxiliary mask structures oriented parallel to the parallel mask structures;
   exposing the substrate to radiation using the parallel mask structures and the parallel marginal auxiliary mask structures to form parallel photoresist structures in the central region of the and parallel marginal photoresist structures in the margin region of the substrate, the discrete auxiliary mask structures disposed between a first of the parallel photoresist structures and a first of the parallel marginal photoresist structures most proximate the first of the parallel photoresist structures;
   forming additional parallel mask structures and a marginal mask structure connected to ends of the additional parallel mask structures over a substrate after exposing the substrate to the radiation the additional parallel mask structures oriented perpendicular to the parallel mask structures and positioned over the central region of substrate, and the marginal mask structure oriented parallel to the parallel mask structures and positioned over the margin region of substrate; and
   exposing the substrate to additional radiation using the additional parallel mask structures and the marginal mask structure to form additional parallel photoresist structures in the central region of the substrate and a marginal photoresist structure in the margin region of the substrate, the additional parallel photoresist structures perpendicularly intersecting the parallel photoresist structures.

8. The double-exposure photolithography method of claim 7, wherein a length of each of the discrete auxiliary mask structures extending in a direction of the parallel mask structures is greater than a width of the additional parallel mask structures thereunder.

9. The double-exposure photolithography method of claim 7, wherein a quantity of the discrete auxiliary mask structure is half a quantity of the additional parallel mask structures, each of the discrete auxiliary structures independently overlying two of the additional parallel mask structures.

\* \* \* \* \*

UNITED STATES PATENT AND TRADEMARK OFFICE
CERTIFICATE OF CORRECTION

PATENT NO.         : 9,268,210 B2                                                    Page 1 of 1
APPLICATION NO.    : 13/964949
DATED              : February 23, 2016
INVENTOR(S)        : Yung-Wen Hung, Cheng-Shuai Li and Yun-Ting Shen It is certified that error appears in the above-identified patent and that said Letters Patent is hereby corrected as shown below:

On the title page:
In ITEM (57) ABSTRACT:

LINE 11,      change "the Second masks" to --the second masks--

In the claims:
CLAIM 7,   COLUMN 7,   LINE 28,   change "of the and" to --of the substrate and--
CLAIM 7,   COLUMN 8,   LINE 6,    change "the radiation the" to --the radiation, the--

Signed and Sealed this
Tenth Day of May, 2016

Michelle K. Lee
*Director of the United States Patent and Trademark Office*